US005389909A

United States Patent [19]
Havens

[11] Patent Number: 5,389,909
[45] Date of Patent: Feb. 14, 1995

[54] OPEN ARCHITECTURE MAGNETIC RESONANCE IMAGING PASSIVELY SHIMMED SUPERCONDUCTING MAGNET ASSEMBLY

[75] Inventor: Timothy J. Havens, Florence, S.C.

[73] Assignee: General Electric Company, Milwaukee, Wis.

[21] Appl. No.: 148,250

[22] Filed: Nov. 8, 1993

[51] Int. Cl.6 .......................... H01F 1/00; H01F 3/00; G01V 3/00
[52] U.S. Cl. .................................. 335/216; 335/298; 324/320
[58] Field of Search ............... 335/296, 297, 298, 299, 335/216; 324/318, 319, 320

[56] References Cited

U.S. PATENT DOCUMENTS

| | | | |
|---|---|---|---|
| 4,698,611 | 10/1987 | Vermilyea | 335/298 |
| 4,924,198 | 5/1990 | Laskaris | 335/216 |
| 4,943,774 | 7/1990 | Breneman | 324/318 |
| 4,990,877 | 2/1991 | Benesch | 335/301 |
| 5,003,266 | 3/1991 | Palkovich | 324/320 |
| 5,003,276 | 3/1991 | Sarwinski | 335/304 |
| 5,045,794 | 9/1991 | Dorri | 324/320 |
| 5,075,624 | 12/1991 | Bezjak | 324/318 |
| 5,291,169 | 3/1994 | Ige | 335/216 |
| 5,304,932 | 4/1994 | Carlson | 324/318 |

Primary Examiner—Leo P. Picard
Assistant Examiner—Stephen T. Ryan
Attorney, Agent, or Firm—Irving M. Freedman; John H. Pilarski

[57] ABSTRACT

A passively shimmed open architecture magnetic resonance imaging magnet utilizing separated superconducting coil assemblies with open space between including apparatus to obtain field homogeneity in the open space by a non-magnetic cylinder in the bore of the magnets for positioning patterns of magnetic shims.

11 Claims, 2 Drawing Sheets

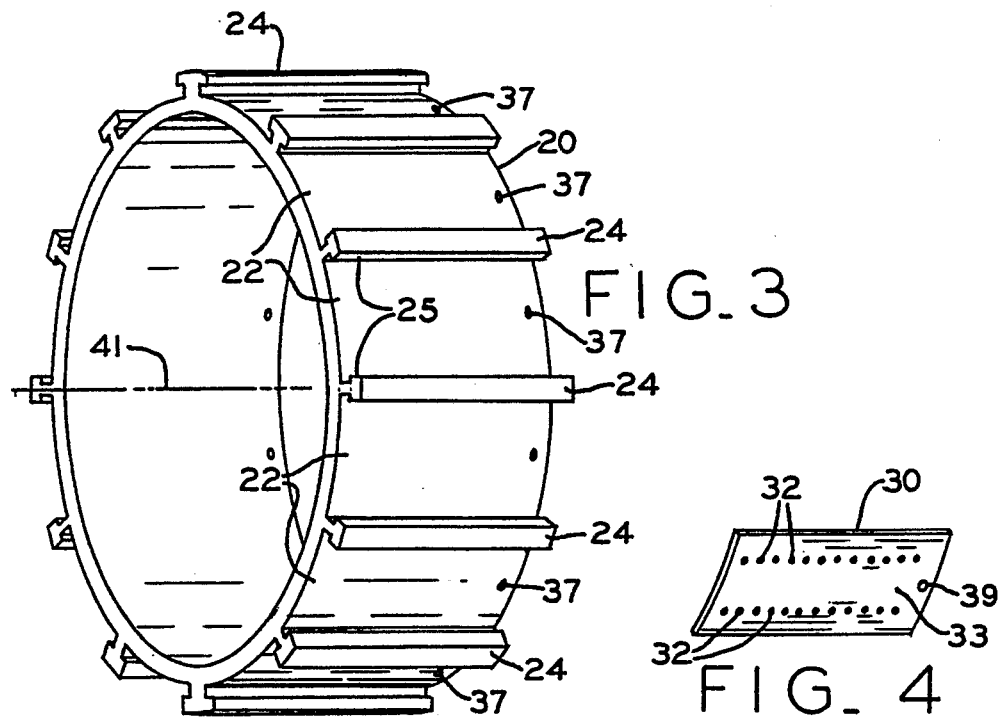
FIG. 3
FIG. 4
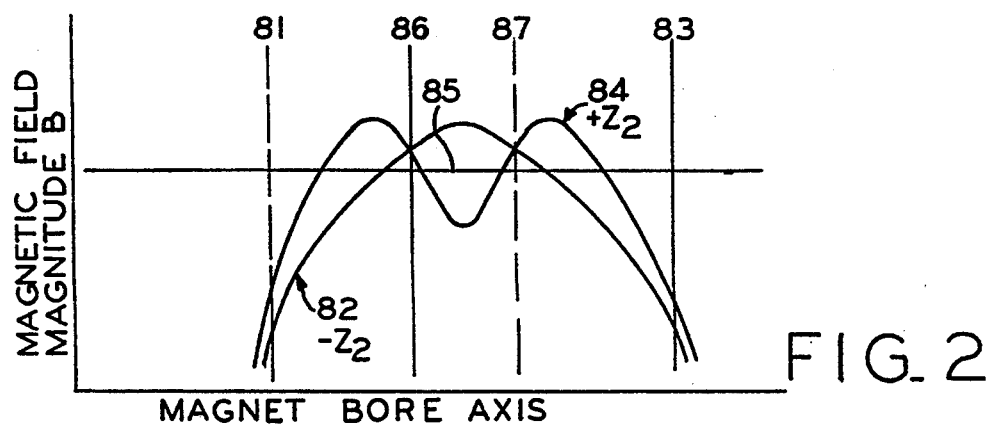
FIG. 2
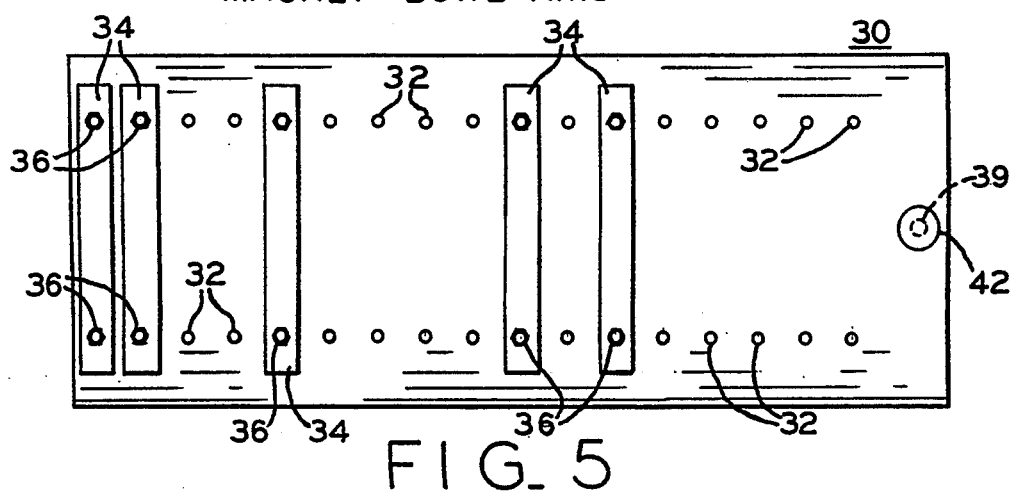
FIG. 5

OPEN ARCHITECTURE MAGNETIC RESONANCE IMAGING PASSIVELY SHIMMED SUPERCONDUCTING MAGNET ASSEMBLY

BACKGROUND OF INVENTION

This invention relates to an open architecture superconducting magnet assembly for a magnetic resonance imaging system (hereinafter called "MRI"), and more particularly to an improved and simplified passive shimming arrangement in such an assembly.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that when a power source is initially connected to the coil (for a period, for example, of ten minutes) to introduce a current flow through the coils, the current will continue to flow through the coils even after power is removed due to the absence of resistance, thereby maintaining a strong magnetic field. Superconducting magnets find wide application in the field of MRI.

Considerable research and development efforts have been directed at eliminating the need for a boiling cryogen such as liquid helium. While the use of liquid helium to provide cryogenic temperatures has been widely practiced and is satisfactory for MRI operation, helium is found and commercially obtained only in the state of Texas. As a result, the provision of a steady supply of liquid helium to MRI installations all over the world has proved to be difficult and costly. This has led to considerable effort being directed at superconducting materials and magnet structures which can be rendered superconducting for MRI use at relatively higher temperatures such as ten degrees Kelvin (10K), which can be obtained with conduction cooling.

Another problem encountered by most MRI equipments is that they utilize solenoidal magnets enclosed in cylindrical structures with a central bore opening for patient access. However, in such an arrangement, the patient is practically enclosed in the warm central bore, which can induce claustrophobia in some patients. The desirability of an open architecture MRI magnet in which the patient is not essentially totally enclosed has long been recognized. Unfortunately, an open architecture MRI magnet poses a number of additional and unique technical problems and challenges. One problem is to provide a suitable superconducting structure which will provide the required magnetic field yet occupies much less space than conventional cylindrical MRI magnet structures, and yet which nevertheless can provide the required strong and extremely homogenous magnetic field even though the spaced magnet coils are under considerable electromagnetic forces, plus thermal forces encountered during cool-down from ambient temperature to superconducting temperatures. An open architecture MRI with which the subject invention could be used is disclosed in U.S. patent application Ser. No. 07/970,511, filed Nov. 2, 1992 by Bu-Xin Xu and Olewasequn Ige entitled "Open Architecture Magnetic Resonance Imaging Superconducting Magnet Assembly," assigned to the same assignee as the subject invention, and hereby incorporated by reference.

In order to compensate for the inhomogeneities in MRI magnets, various arrangements including ferromagnetic shim materials have been used. However, the need for magnetic field homogeneity is most critical in the central region of an MRI magnet, the very region in an open MRI magnet which is not available for the placement of effective shimming material adding to the basic problem. The central region of an MRI magnet is the very region which for a variety of technical reasons or problems is the region of interest where the patient imaging must take place.

Moreover, open architecture MRI magnets tend to produce increased field inhomogeneity in this region of interest due to increased coil deformations and coil misalignment. Prior art superconducting magnet designs are directed at minimizing such inhomogeneity during the design stage, and then add passive shim systems to reduce the inhomogeneity that remains after the manufacturing cycle due to manufacturing tolerances and design restrictions. This results in an open architecture MRI magnet that requires shimming in the open area of the magnet between the two superconducting coil assemblies, or on the outer surfaces of the vacuum vessel enclosing the superconducting coil assemblies. The open area is not available for placing shims in an open architecture MRI magnet design. Placing shims on the outer surface of the vacuum vessel is not desirable because the shims are not as effective in that location, requiring that they be thicker such that the forces on the shims are very large.

Furthermore, the outer surface region is frequently not readily accessible at the hospital installation site. In addition, adding passive shim assemblies to the outer surfaces of the vacuum vessel results in considerable additional expense.

Finally, there are a number of other problems, including problems of differential thermal expansion and contraction of materials, of minimizing cost, and of handling the forces generated by the significant magnetic fields required. All of these overlapping and at times conflicting requirements must be satisfied for a practical and satisfactory MRI superconducting magnet structure.

OBJECTS AND SUMMARY OF INVENTION

It is an object of the present invention to provide an improved superconducting magnet coil assembly for an open architecture MRI magnet which provides desired field homogeneity while improving and simplifying the passive shim assemblies.

It is another object of the present invention to provide an improved superconducting magnet coil assembly for an open architecture MRI magnet in which inhomogeneities in the magnetic field may be minimized by an adjustable shim mechanism which can be tailored to each equipment and equipment installation.

It is a further object of the present invention to provide an uncomplex passive shimming arrangement in an open architecture. MRI magnet which provides a wide latitude of adjustment in an uncomplex manner after the MRI magnet is installed and operating.

In accordance with one form of the invention, an open architecture superconducting MRI magnet utilizes two superconducting magnet assemblies, each including a main magnet coil and a correction coil on a coil support structure. The magnet assemblies are positioned to provide a positive Z2 magnetic field component in the shim region in the absence of a passive shimming assembly in accordance with the present invention.

A passive shimming assembly substantially cylindrical in shape is positioned in the bore of the magnet assemblies and includes a non-magnetic drum with axially extending slots to detachably secure non-magnetic arcuate drawers on which magnet shims may be selectively positioned.

The shims are arcuate and of varying thickness and a plurality of shims may be selectively positioned on fastening positions extending across the drums. The drawers may be individually detached and shims selectively positioned while the magnet is in operation to provide a homogenous field in the central imaging region between the magnet assemblies.

BRIEF DESCRIPTION OF DRAWINGS

FIG. 2 is a plot useful in explaining aspects of the present invention.

FIG. 3 is a perspective view, showing details of the passive shimming structure of FIG. 1.

FIG. 4 shows details of the shim support drawers of FIG. 1.

FIG. 5 is an enlarged view illustrating the use of the shim support drawers of FIG. 4.

DETAILED DESCRIPTION OF PREFERRED EMBODIMENT OF INVENTION

Figure 1:
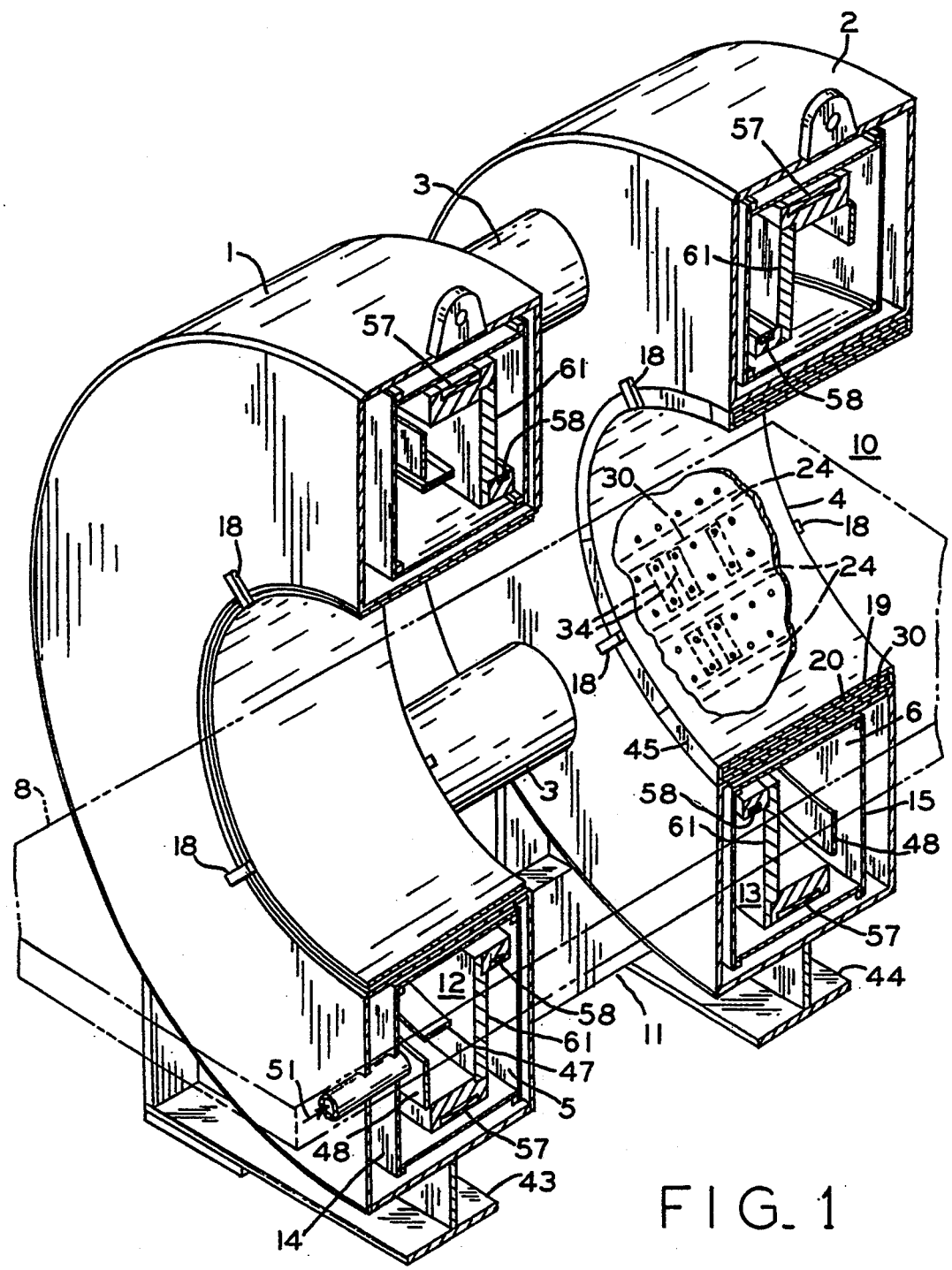
FIG. 1 is a perspective view, partially in cross section, of an MRI superconducting magnet incorporating the present invention.

Referring first to FIG. 1, superconducting magnet assembly 10 includes a pair of torroidal-shaped vacuum vessels or housings 1 and 2 separated by three or four axially extending stainless steel spacers 3 positioned some 90 degrees apart around the axis of substantially cylindrical central bore 4. The structure is symmetrically arranged about bore 4 of superconducting magnet assembly 10. It is to be noted that the overall structure formed by vacuum vessels 1 and 2 and spacer posts 3 provides substantial openings or open space 11 between vacuum vessels 1 and 2 which avoids enclosure of the patient positioned on the patient support shown generally by dashed member 8. The use of three spacers 3 could be used, leaving more than 90° of open space for use and access by a medical practitioner, such as a surgeon, to a patient being imaged by the MRI equipment. Alternatively, four spacers could be used but spaced to provide access in excess of 90°.

Annular cylinders 14 and 15 of rectangular cross section are radiation shields between superconducting magnet coil assemblies 12 and 13, respectively, and vacuum vessels 1 and 2, respectively. Each superconducting magnet assembly 12 and 13 includes an annular main magnet coil 57 and an annular correction magnet coil 58, wound in cavities or annular grooves with rectangular cross section within magnet coil form 61. Magnet coils 57 and 58 are wound of copper stabilized niobium tin ($Nb_3Sn$) ribbon conductor.

Conduction cooling flow indicated generally by arrow 51 provided by a cryocooler passes through conduits to the interior annular chambers 5 and 6 of annular cylinders 14 and 15, respectively, to cool main magnet coils 57 and correcting magnet coils 58 to superconducting temperatures in the order of ten degrees Kelvin (10K) to avoid the use of liquid helium cryogen cooling. Power to energize, main magnet coil 57 and correction magnet coil 58, is supplied by way of suitable electrical connections (not shown).

Referring next to FIG. 2. FIG. 2 is a plot illustrating the magnitude of magnetic field along axis 41 of magnetic bore 4 with the positions of the centers of main magnet coils 57 in the axial direction shown by dotted lines 81 and 83. The magnetic field homogeneity indicated by plot 84 is not uniform as indicated by the positive Z2 component of the field which would normally be reduced as much as possible in an optimum design directed at obtaining a flat homogenous magnetic field in the patient imaging area indicated generally by the region between dotted lines 86 and 87. The positive Z2 component results from the locations of the coils in magnetic coil assemblies 12 and 13 (see FIG. 1). Plot 82 depicts a magnetic field with a negative Z2 component in the patient imaging area.

The field plot in accordance with the present invention is deliberately tailored in the absence of passive magnet shim assembly 19 to provide a positive Z2 component of the magnetic field strength in the central imaging region between positions 86 and 87 while increasing the magnetic field in the region of main magnet positions 81 and 83 as shown by plot 84. This may be accomplished by moving or positioning correction or bucking coils 58 further from axis 41 of bore 4, or preferably by positioning main magnet coils 57 such that main magnet coil positions 81 and 83 are moved slightly further apart than would be provided in a normal design for optimal magnetic homogeneity in the central region between the coils. Such movement might be as small as a fraction of an inch, and the coil displacement can be optimized by one skilled in the art to provide the desired magnetic field of FIG. 2 and to assist in final placement of shims 34 by analyzing the design field together with typical error fields generated during the manufacturing process or during the hospital siting process with a computer code such as that described in U.S. Pat. No. 5,045,794 of Bizhan Dorri and Mark E. Vermilyea entitled "Method of Optimizing Passive Shim Placement in Magnetic Resonance Magnets," assigned to the same assignee as the subject invention, and hereby incorporated by reference. The central region between lines 86 and 87 is the limited region of accurate imaging operation of an MRI, and is the region in which the portion of the patient to be imaged is positioned. That is why, for maximum sensitivity of magnetic resonance imaging, the MRI magnet designer normally seeks to obtain a uniform magnetic field in the central region between the magnets in that region.

However, in the case of the open architecture design the use of magnet shimming to provide the necessary field homogeneity cannot be accomplished by conventional passive magnetic shimming as discussed above. The problem is even greater in the case of MRI equipment utilizing spacer posts 3 which are not uniformly positioned around the bore in order to provide a sufficient open area for patient access by a surgeon during an operation.

Displacing the coils from positions for optimal homogeneity to create the positive Z2 component in the magnet's field in the imaging volume of region 86, 87 results in higher field regions toward the two magnet housings 1 and 2 of magnet assembly 10. This field configuration produces the desirable result that the field can be made uniform by adding shims to the magnetic shim assembly 19 fabricated in accordance with the present invention. As described in detail below, passive magnetic shim assembly 19 is provided at each housing 1 and 2 in order to accomplish the necessary tailoring of the superconducting magnetic field in bore 4 in region 86, 87 to provide a flattened or homogeneous plot 85 in the region. Passive magnet shim assembly 19 is positioned as a sleeve within, and in contact with, the bore of vacuum vessels 1 and 2 and selectively secured by fasteners or retainers 18 which enable access to the interior of the magnet shim assembly through suitable means such as door or door sections 45.

Details of passive magnet shim assembly 19 are best shown in FIGS. 3, 4 and 5. Referring to FIGS. 3, 4 and 5, passive magnet shim assembly 19 includes a magnet positioning and mounting drum 20 within the sleeve surrounding bore 41, fabricated of non-magnetic material and including a plurality of integral slots 22 separated by guides and positioning means, or rails, 24 which have a T-shaped cross section. The T-shaped rails 24 enable the insertion and retention of shim drawers or supports 30 which may be slid into, or withdrawn from, shim drum 20 and supported against radial movement by overlapping edges 25 of T-shaped guides 24 to resist the strong magnetic forces asserted against magnetic shims 34 positioned on the drawers during superconducting magnet operation. Shim drawer 30 is secured against axial movement by bolt 42 passing through aperture 39 in the shim drawer and threaded into threaded apertures 37 in slots 22 of drum 20.

As best shown in FIG. 5, shim drawer 30 includes two rows of axially spaced mounting apertures or members 32 extending along the length in the axial direction of the shim drawer. A plurality of shims 34 may be selectively positioned across shim drawer 30 as shown by way of example in FIGS. 1 and 5. Magnet shims or members 34 include fastening means to secure each shim in a selected position on magnet drawer 30. Suitable fastening means such as bolts 36 passing through apertures in shims 34 to mate with threaded bores 32 in slots 22 may be utilized for the fastening means. In one embodiment of the invention magnetic shim members 34 were slightly less than 1" wide×6" long with apertures 32 spaced 1" apart in the axial direction in order to enable the side by side placement of magnetic shim members such as shown on the left side of FIG. 5. In addition, the thickness of magnetic shim members 34 in the radial direction from axis 41 is variable. Shims having radial thicknesses ranging from 1 mil to 40 mils have been utilized such that magnetic shim members 34 of selected thicknesses are selectively placed along magnet drawer 30 to tailor the magnetic field in bore 4 to provide a desired and required field homogeneity in the central imaging region 86, 87 between vacuum vessels 1 and 2 required for effective and improved magnetic resonance imaging.

In one embodiment of the invention shim drum 20 is 32 inches in diameter utilizing 12 magnet drawers 30 each extending approximately 30° of arc around bore axis 41 of MRI magnetic bore 4. Each drawer 30 may conveniently include 15 to 20 pairs of mounting apertures 32 providing up to 240 positions on drum 20 on which magnetic shims 34 may be positioned to accurately and precisely tailor the magnetic field homogeneity in bore 4 to that required.

While superconducting magnet assembly 10 may be, and is, adjusted for field homogeneity during factory testing and operation, it is necessary to further adjust the magnetic field for the particular installation area such as a hospital imaging room. The MRI room in a hospital may be in relatively close proximity to other electronic devices which can be disturbed by the stray field of the MRI magnet 10. In addition, the stray field of MRI magnet 10 greater than 5 gauss by regulation must be restricted from contacting the general public. To satisfy these requirements, magnetic shielding is frequently added to the hospital site, and this room shielding itself can disturb or perturb the homogeneity of the magnetic field of the MRI magnet 10. As a result final magnetic field adjustment is made at the installation. This can be accomplished by opening doors such as 45 or other axial access members to the housing of passive magnetic shim assembly 19 and selectively removing one or more magnetic drawers 30 to reposition, replace or add selected thickness magnetic shim members 34 on the magnetic drawer in order to tailor and obtain the desired magnetic field pattern and homogeneity in the critical central imaging region (86, 87 in FIG. 2). This can, and as a practical matter must, be accomplished during superconducting operation of the magnetic resonance imaging system. The present invention readily accommodates such final field homogeneity adjustments after installation of the MRI magnet, or as may be subsequently required because of changes in and around the imaging room.

While the present invention has been described with respect to certain preferred embodiments thereof, it is to be understood that numerous variations in the details of construction, the arrangement and combination of parts, and the types of materials used may be made without departing from the spirit and scope of the invention.

What I claim is:

1. An open architecture magnetic resonance imaging magnet utilizing a separated pair of superconducting magnet coil assemblies positioned about the axis thereof and forming an axial bore to receive patients, and providing open radial space between the magnet coil assemblies to minimize confinement to the patient within the axial bore and to maximize access to the patient in the open radial space comprising:

a first annular superconducting magnet assembly positioned about said axis including a first axially extending central opening;

a second annular superconducting magnet assembly positioned about said axis, and spaced from and substantially parallel to said first magnet assembly including a second axially extending central opening;

said bore formed by said central axially extending openings of said first and second magnet assemblies about said axis;

a plurality of spacers extending between said first magnet coil assembly and said second magnet coil assembly;

each of said magnet assemblies including at least one superconducting magnet coil in a housing and means to cool the interior of said housing and said magnet coil to superconducting temperatures to provide a magnetic field within said bore;

said magnet assemblies being configured and positioned to preclude a negative Z2 component of said magnetic field and providing a substantial positive Z2 magnetic field in the central patient imaging region in the axial space of the bore between and outside the bores of the superconducting magnet coil assemblies; and a passive magnetic shim assembly positioned substantially within and contiguous to at least one of said axially extending central openings of said housing without axially extending through the region between said housings, and including a plurality of magnetic shim members selectively positionable on said passive shim assembly and about said axis to improve the magnetic homogeneity in said central opening of said bore between said magnet coil assemblies;

whereby said patient imaging region between said housings is substantially free of magnetic shim members and whereby said magnetic coil assemblies provide an inhomogeneous magnetic field in said central patient imaging region therebetween which said shim members improve.

2. The passively shimmed open architecture magnetic resonance imaging magnet of claim 1 wherein the position, of said magnetic shim members may be varied and said patient imaging region is accessible to a medical practitioner without discontinuing the superconducting operation of said magnet.

3. The passively shimmed open architecture magnetic resonance imaging magnet of claim 2 wherein said passive magnetic shim assembly includes a plurality of arcuate non-magnetic supports and means to selectively secure said magnetic shim members to selected portions of said non-magnetic support.

4. The passively shimmed open architecture magnetic resonance imaging magnet of claim 3 wherein said non-magnetic supports include a plurality of axially extending means for detachably securing said magnetic shim member in place thereon.

5. The passively shimmed open architecture magnetic resonance imaging magnet of claim 2 wherein said magnetic members are arcuate in shape and of varying thickness in the radial direction of said bore.

6. The passively shimmed open architecture magnetic resonance imaging magnet of claim 5 wherein said magnetic shim members extend axially along said supports a distance slightly less than the axial distance between adjacent of said selected portions of said support providing adequate axial space for close side by side placement of said magnetic shim members in side by side relationship.

7. The passively shimmed open architecture magnetic resonance imaging magnet of claim 2 wherein the components of said magnetic field in said central patient imaging region of said housing is provided the axial distance between said magnet coil assemblies.

8. The passively shimmed open architecture magnetic resonance imaging magnet of claim 7 wherein said arcuate supports each extend approximately 30° around said axis.

9. The passively shimmed open architecture magnetic resonance imaging magnet of claim 5 wherein said magnetic shim members are approximately 1 inch wide in the axial direction and approximately 6 inches long in the azmithal direction.

10. The passively shimmed open architecture magnetic resonance imaging magnet of claim 2 wherein a patient support extends along said axis through said first and second axially extending central openings and through said patient imaging region and positioned to provide support for a patient in said patient imaging area.

11. The passively shimmed open architecture magnetic resonance imager of claim 10 wherein there are at least three of said spacers positioned about said axis to provide more than 90 degrees of opening in the radial direction about said axis and said patient support.

* * * * *